(12) United States Patent
Voshell et al.

(10) Patent No.: US 6,173,424 B1
(45) Date of Patent: Jan. 9, 2001

(54) PROGRAMMABLE PULSE GENERATOR AND METHOD FOR USING SAME

(75) Inventors: Thomas W. Voshell, Boise; R. Brent Lindsay, Meridian, both of ID (US)

(73) Assignee: Micron Technology, Inc., Boise, ID (US)

( * ) Notice: Under 35 U.S.C. 154(b), the term of this patent shall be extended for 0 days.

(21) Appl. No.: 09/001,264

(22) Filed: Dec. 31, 1997

(51) Int. Cl.[7] .............................. G11C 29/00; G06F 1/04; H03K 3/00
(52) U.S. Cl. ..................... 714/718; 714/721; 327/176; 327/264; 327/291; 365/189.09; 365/201
(58) Field of Search ..................... 714/738, 744, 714/742, 743, 718, 721; 365/201, 189.09, 149; 307/311, 119; 327/170, 172, 175, 176, 244, 245, 251, 259, 264, 265, 269, 272, 276, 278, 291, 530

(56) References Cited

U.S. PATENT DOCUMENTS

| | | | |
|---|---|---|---|
| 3,980,903 | * 9/1976 | Jamee | 307/311 |
| 4,415,861 | * 11/1983 | Palmquist et al. | 327/176 |
| 4,766,328 | * 8/1988 | Yang | 307/106 |
| 5,297,151 | * 3/1994 | Gruetzner et al. | 714/738 |
| 5,317,532 | * 5/1994 | Ochii | 365/149 |
| 5,376,849 | * 12/1994 | Dickol et al. | 327/278 |
| 5,390,192 | * 2/1995 | Fujieda | 714/738 |
| 5,801,566 | * 9/1998 | Tanaka | 327/259 |
| 5,878,055 | * 3/1999 | Allen | 714/744 |
| 5,886,428 | * 3/1999 | Feiler et al. | 307/119 |

* cited by examiner

*Primary Examiner*—Emmanuel L. Moise
(74) *Attorney, Agent, or Firm*—Dorsey & Whitney LLP

(57) ABSTRACT

A system is described for providing pulses to test a semiconductor device, such as a memory device. The system includes several voltage sources, each voltage source being coupled to an output terminal through a pass gate. A control logic circuit provides a control signal to each of the pass gates to render the pass gates conductive in a sequence. A voltage generated by each voltage source is coupled to the output terminal in a sequence to generate a series of pulses at the output terminal. Each of the voltage sources may be a programmable digital-to-analog converter receiving a voltage control signal and generating a voltage based on the voltage control signal.

16 Claims, 4 Drawing Sheets

PROGRAMMABLE PULSE GENERATOR AND METHOD FOR USING SAME

TECHNICAL FIELD

The present invention relates generally to pulse generators, and more particularly, to a pulse generator for generating pulses which vary between at least two programmable voltage levels.

BACKGROUND OF THE INVENTION

Semiconductor devices such as memory devices are tested during manufacture by applying pulses to a terminal of a selected memory device while data is being written to or read from the memory device. Ideally, the operation of the memory device during such a test will not be affected by the pulses. The pulses are typically provided from a pulse generator. It is often desirable to program the voltage levels of the pulses with a programmable pulse generator. It is also desirable that the pulses have relatively high voltage levels with a fast rise time and a fast fall time.

One conventional method of generating pulses at programmable voltage levels is to generate a standard logic level pulse from a conventional logic device such as a CMOS gate, a Field Programmable Gate Array (FPGA), or an Application-Specific Integrated Circuit (ASIC). The standard logic level pulse is then converted to a programmable level by an additional circuit such as a pin driver device. Pin driver devices are general purpose devices used in a wide range of applications. However, pin driver devices generally do not have the capability to generate relatively high voltage level pulses which have a fast rise time and a fast fall time.

Programmable pulses may also be generated by a conventional pulse generator 10 shown in FIG. 1. The pulse generator 10 includes three voltage sources 12, 14, and 16. Each of the voltage sources 12, 14, and 16 has an output coupled to an input of a respective one of three electromechanical relays 18, 20, and 22. Each of the electromechanical relays 18, 20, and 22 has an output coupled to an output terminal 24, and it receives a respective control signal from a system logic circuit 26. The system logic circuit 26 generates the control signals to render each of the electromechanical relays 18, 20, and 22 conductive in a sequence to couple the outputs of the voltage sources 12, 14, and 16 to the output terminal 24 in a sequence to generate voltage pulses. The voltage pulses may be applied to a memory device 28 coupled to the output terminal 24.

The electromechanical relays 18, 20, and 22 have a slow reaction time and, as a result, there is a long delay between a change in one of the control signals and a change in the conductive state of the electromechanical relay which receives the control signal. The slow reaction time of the electromechanical relays 18, 20, and 22 slows the operation of the pulse generator 10 with respect to the speed of operation of the memory device under test. The slow operation of the pulse generator 10 adds significant overhead cost to a test of a memory device.

SUMMARY OF THE INVENTION

In accordance with the present invention, an improved pulse generator is provided that is structured to generate pulses to be provided to an input terminal of a semiconductor device. The pulse generator includes several electronic switches. Each electronic switch has a control terminal, an input terminal coupled to one of several differentiated voltage sources, and an output terminal coupled to the input terminal of the semiconductor device. The pulse generator also includes a control logic circuit having several outputs, each output being coupled to the control terminal of one of the electronic switches. The control logic circuit is structured to render selected electronic switches conductive in a sequence to couple selected ones of the voltage sources to the input terminal of the semiconductor device in a sequence. Each electronic switch may be a pass gate, and one of the voltage sources may be a ground voltage reference. In addition, the remaining voltage sources may be programmable voltage sources each having a voltage control signal input coupled to receive a voltage control signal from the control logic circuit.

In another embodiment, a method is provided for testing a semiconductor device having an input terminal. Each of several electronic switches are coupled between one of several differentiated voltage sources and the input terminal of the semiconductor device. Each of the electronic switches is controlled to be rendered conductive or nonconductive in a sequence to couple selected ones of the voltage sources to the input terminal of the semiconductor device in a sequence.

DETAILED DESCRIPTION OF THE INVENTION

Figure 1:
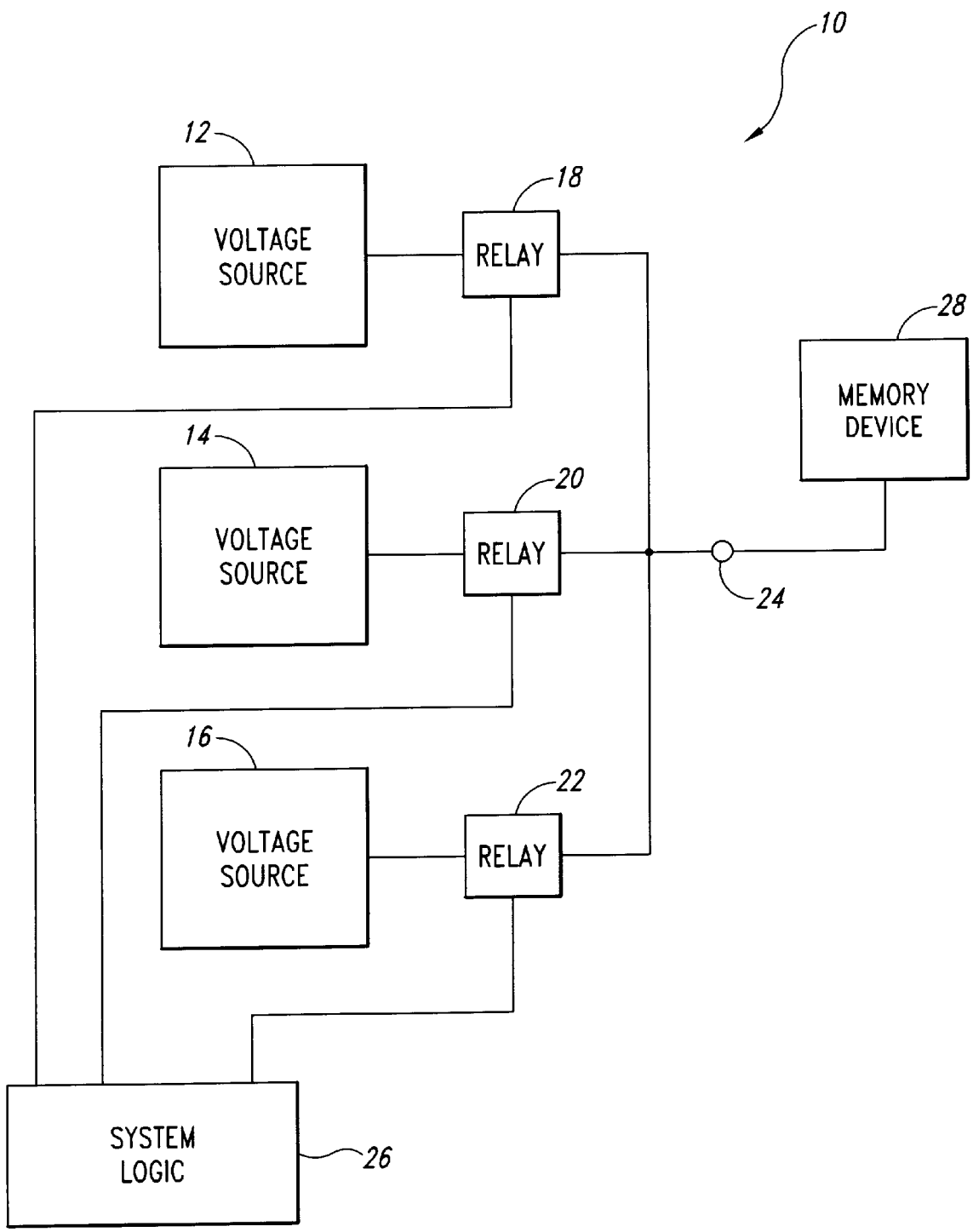
FIG. 1 is an electrical schematic diagram of a pulse generator according to the prior art
Figure 2A:
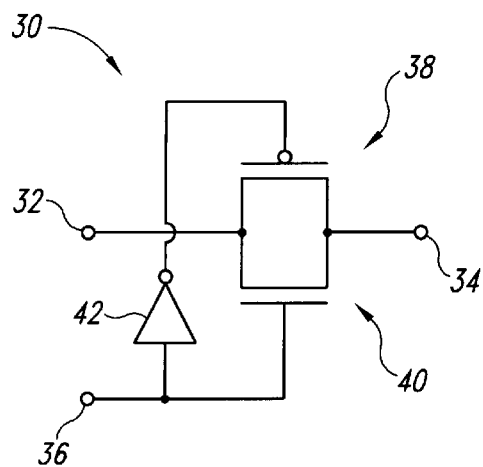
FIG. 2A is an electrical schematic diagram of a pass gate and an inverter according to the prior art.

Electronic switches such as BJT's, optoelectronic switches, and field effect devices such as JFET's, MOSFET's and pass gates react much more quickly to a change in a digital control signal than electromechanical relays such as those described with respect to FIG. 1. An example of a pass gate 30 is shown in FIG. 2A. The pass gate 30 is connected between an input terminal 32 and an output terminal 34 and, when rendered conductive by a digital control signal applied to a control terminal 36, the pass gate 30 provides a conductive coupling between the terminals 32 and 34. The pass gate 30 includes a PMOS transistor 38, and an NMOS transistor 40. A source of the PMOS transistor 38 and a source of the NMOS transistor 40 are connected together to the input terminal 32, and a drain of the PMOS transistor 38 and a drain of the NMOS transistor 40 are connected together to the output terminal 34. The control terminal 36 is connected to a gate of the NMOS transistor 40 and to an input of an inverter 42. An output of the inverter 42 is connected to a gate of the PMOS transistor 38.

The pass gate 30 is operated in the following manner. The control signal is applied to the control terminal 36 and thereby to the gate of the NMOS transistor 40 and the input of the inverter 42. The inverter 42 inverts the control signal and applies an inverted control signal to the gate of the PMOS transistor 38. If the control signal is low, both the NMOS transistor 40 and the PMOS transistor 38 are rendered nonconductive. As a result, the pass gate 30 is nonconductive, and a voltage at the input terminal 32 is isolated from the output terminal 34. If the control signal is high, both the NMOS transistor 40 and the PMOS transistor 38 are rendered conductive. As a result, a conductive path is established through the pass gate 30 between the input terminal 32 and the output terminal 34 such that the voltages at the terminals 32 and 34 are rapidly equalized.

Figure 2B:
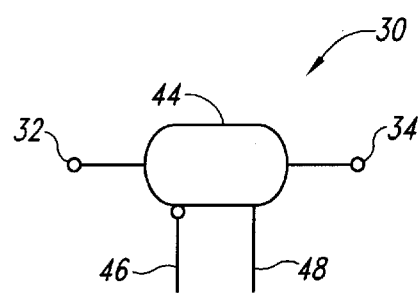
FIG. 2B is a symbolic diagram of a pass gate according to the prior art.

A symbolic diagram of the pass gate 30 is shown in FIG. 2B. Elements in FIG. 2B similar to those in FIG. 2A have been given the same reference numerals for purposes of brevity. The pass gate 30 is represented by an oval 44 which is connected between the input terminal 32 and the output terminal 34. A line 46 is connected to the gate of the PMOS transistor 38 and a line 48 is connected to the gate of the NMOS transistor 40. Pass gates are commercially available from Analog Devices having model numbers ADG411, ADG412, and ADG413.

The pass gate 30 shown in FIG. 2A reacts rapidly in response to a change in the control signal applied to the control terminal 36. The other types of electronic switches mentioned above provide similar performance advantages. For example, a depletion mode transistor will conduct current when its gate is grounded and is rendered nonconductive when a voltage is applied to its gate. An alternative electronic switch may comprise a single PMOS transistor or a single NMOS transistor which is rendered conductive with a boosted gate voltage.

Figure 3:
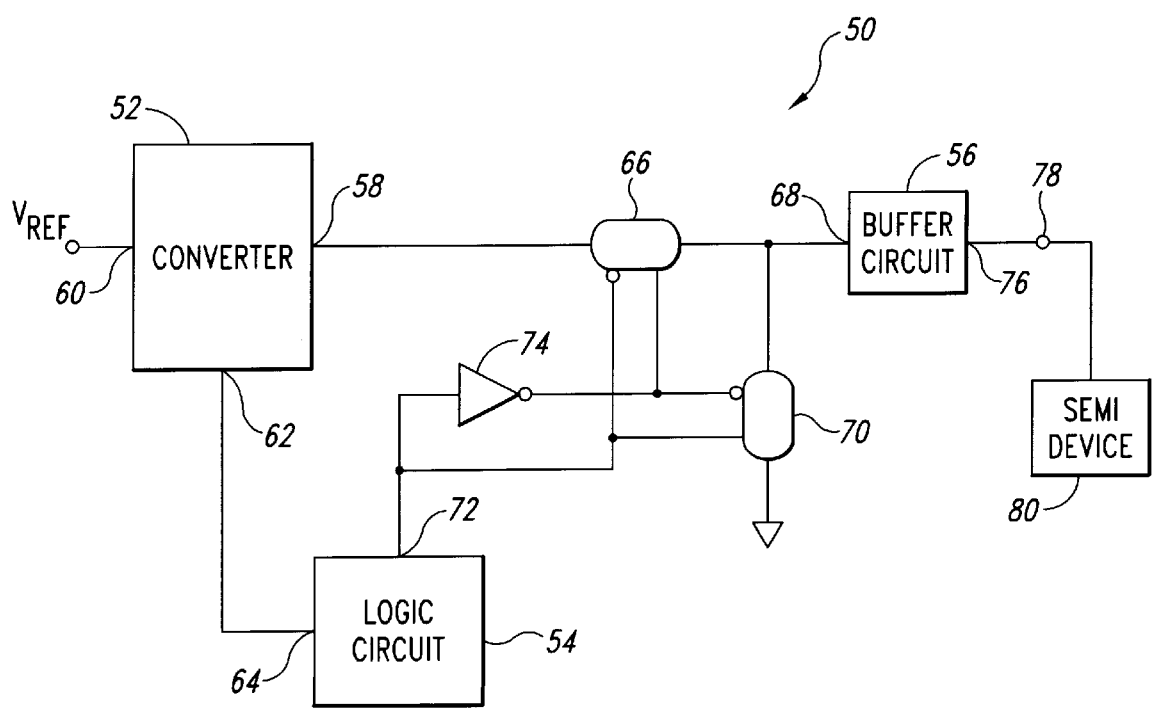
FIG. 3 is an electrical schematic diagram of a programmable pulse generator having two voltage sources according to the present invention.

A programmable pulse generator 50 according to one embodiment of the invention is shown in FIG. 3. The programmable pulse generator 50 includes a digital-to-analog converter 52, a logic circuit 54, and a buffer circuit 56. A typical digital-to-analog converter is sold by Analog Devices with a model number AD664. The logic circuit 54 may be any programmable digital circuit such as an FPGA, an ASIC, or a microprocessor. A typical buffer circuit is commercially available from National Semiconductor having model number LH4001.

The digital-to-analog converter 52 provides a programmable voltage at a port 58 which is derived from a reference voltage $V_{REF}$ received at a port 60. The reference voltage $V_{REF}$ may originate from a band gap reference voltage source, not shown, which is well known to those skilled in the art. The programmable voltage provided at the port 58 is governed by a voltage control signal provided to a port 62 in the digital-to-analog converter 52 from a port 64 in the logic circuit 54. The port 58 is coupled to provide the programmable voltage to an input terminal of a first pass gate 66. 15 An output terminal of the first pass gate 66 is coupled to an input 68 of the buffer circuit 56 and to an input terminal of a second pass gate 70. An output terminal of the second pass gate 70 is connected to a ground voltage reference. A conductive state of each of the pass gates 66 and 70 is controlled by a pass gate control signal provided at a port 72 of the logic circuit 54. The port 72 is connected to a gate of a P-channel transistor in the first pass gate 66 and a gate of an N-channel transistor in the second pass gate 70, and to an input of an inverter 74. An output of the inverter 74 is connected to a gate of an N-channel transistor in the first pass gate 66 and to a gate of a P-channel transistor in the second pass gate 70.

The buffer circuit 56 transfers a voltage at the input 68 to an output 76 which is coupled to an output terminal 78. The output terminal 78 may be coupled to an input of a semiconductor device 80.

The programmable pulse generator 50 is operated to provide voltage pulses from the output terminal 78 to the semiconductor device 80 in the following manner. The logic circuit 54 generates the voltage control signal provided from the port 64 which governs the programmable voltage provided by the digital-to-analog converter 52 at the port 58. The upper voltage level of the pulses is thereby governed by the logic circuit 54. The logic circuit 54 generates the pass gate control signal provided at the port 72 to control a conductive state of each of the pass gates 66 and 70. When the pass gate control signal is high, the first pass gate 66 is rendered nonconductive and the second pass gate 70 is rendered conductive to couple the ground voltage reference to the input 68 of the buffer circuit 56. The buffer circuit 56 couples the ground voltage to the semiconductor device 80 through the output terminal 78. Conversely, when the pass gate control signal is low, the first pass gate 66 is rendered conductive while the second pass gate 70 is rendered nonconductive to couple the programmable voltage to the input 68 of the buffer circuit 56 which is coupled to the semiconductor device 80. The logic circuit 54 generates the pass gate control signal to be alternately high and low in a sequence to sequentially make each of the pass gates 66 and 70 conductive. The pulses at the output terminal 78 vary between the ground voltage and the programmable voltage provided at the port 58 which is, in turn, governed by the voltage control signal provided at the port 64. The logic circuit 54 may be programmed to generate the pass gate control and voltage control signals according to any one of many well-known methods.

Figure 4:
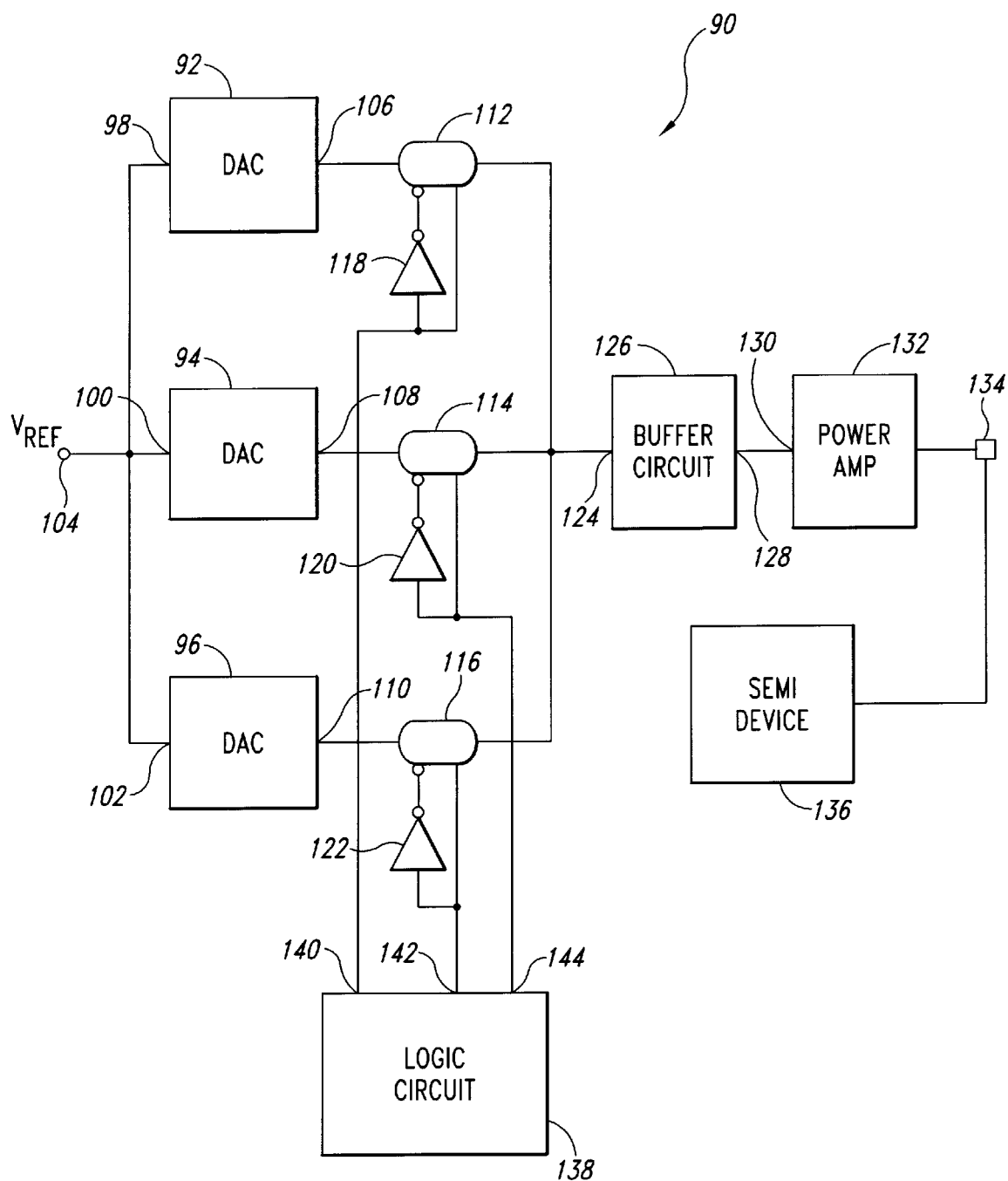
FIG. 4 is an electrical schematic diagram of a programmable pulse generator having three voltage sources according to the present invention.

A programmable pulse generator 90 according to another embodiment of the invention is shown in FIG. 4. The programmable pulse generator 90 includes first, second, and third digital-to-analog converters 92, 94, and 96. Each of the digital-to-analog converters 92, 94, and 96 has a respective input port 98, 100, and 102 connected to receive a reference voltage $V_{REF}$ at a terminal 104, and a respective output port 106, 108, and 110 connected to an input terminal of one of first, second, and third pass gates 112, 114, and 116, respectively.

The pass gates 112, 114, and 116 are each connected to a respective inverter 118, 120, and 122. Each of the pass gates 112, 114, and 116 has a respective output terminal connected to an input terminal 124 of a conventional buffer circuit 126.

The buffer circuit 126 has an output terminal 128 connected to an input terminal 130 of a conventional power amplifier 132. The power amplifier 132 has an output terminal 134 coupled to a semiconductor device 136. A voltage provided to the input terminal 124 of the buffer circuit 126 is coupled to the output terminal 128 and to the input terminal 130 of the power amplifier 132. The voltage is then amplified and provided to the output terminal 134 to be applied to the semiconductor device 136 that is under test. A typical buffer circuit is commercially available from National Semiconductor having model number LH4001.

The programmable pulse generator 90 includes a logic circuit 138 having three ports 140, 142, and 144. The logic circuit 138 may be an FPGA, an ASIC, or a microprocessor. The logic circuit is programmed to generate first, second, and third pass gate control signals, which are provided from the ports 140, 142, and 144, respectively, to the pass gates 112, 114, and 116, respectively, either directly or through the respective inverters 118, 120, and 122. The pass gate control signals control a conductive state of each of the pass gates 112, 114, and 116 as explained above with reference to FIG. 2A.

The programmable pulse generator 90 is operated to provide pulses at 15 the output terminal 134 in the following manner. Each of the digital-to-analog converters 92, 94, and 96 is preprogrammed to provide a selected voltage at the respective output ports 106, 108, and 110. One of the voltages may be a ground voltage. The voltages generated by the digital-to-analog converters 92, 94, and 96 are derived from the reference voltage $V_{REF}$ provided at the terminal 104. The reference voltage $V_{REF}$ may be provided by a band gap reference voltage source, not shown, which is well known to those skilled in the art. The logic circuit 138 is programmed to generate the pass gate control signals according to any one of many well-known methods.

The pass gate control signals are generated by the logic circuit 138 to render the pass gates 112, 114, and 116 conductive in a sequence to couple the voltages provided at the output ports 106, 108, and 110 in a sequence to generate pulses at the input terminal 124 of the buffer circuit 126. Only one of the pass gates 112, 114, and 116 is rendered conductive at any one time. The buffer circuit 126 couples the pulses to the power amplifier 132 which provides amplified pulses at the output terminal 134. The pulses may be applied to the semiconductor device 136. The pass gates 112, 114, and 116 as well as the buffer circuit 126 and the power amplifier 132 react rapidly to change the voltage provided at the output terminal 134 based on changes in the pass gate control signals.

Figure 5:
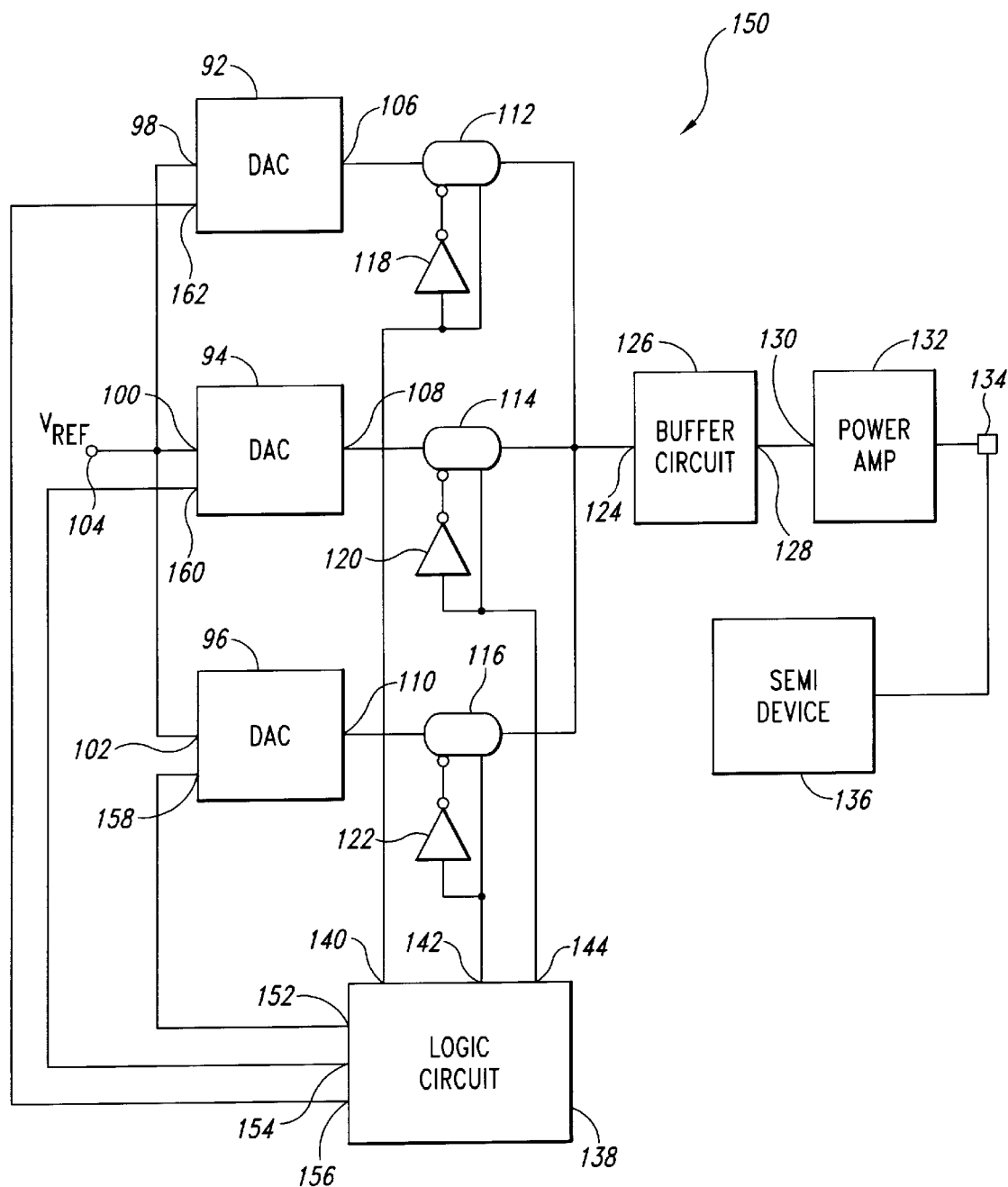
FIG. 5 is an electrical schematic diagram of a programmable pulse generator having three programmable voltage sources according to the present invention.

A programmable pulse generator 150 according to another embodiment of the invention is shown in FIG. 5. The programmable pulse generator 150 is similar to the programmable pulse generator 90 shown in FIG. 4, and similar elements have been given the same reference numerals for purposes of brevity. The logic circuit 138 includes three additional voltage control ports 152, 154, and 156. The logic circuit 138 is programmed to generate first, second, and third voltage control signals which are provided, respectively, from the voltage control ports 152, 154, and 156 to three voltage control signal inputs 158, 160, and 162 in the digital-to-analog converters 96, 94, and 92. The digital-to-analog converters 92, 94, and 96 provide programmable voltages at the respective output ports 106, 108, and 110 in response to the voltage control signals.

The logic circuit 138 generates the voltage control signals according to any one of many well-known methods to control the levels of the programmable voltages.

The programmable pulse generator 150 is operated to provide pulses at the output terminal 134 in a manner similar to the operation of the programmable pulse generator 90 shown in FIG. 4. In addition, the logic circuit 138 generates the voltage control signals to direct a level of each programmable voltage generated by the digital-to-analog converters 92, 94, and 96. The voltage levels of the pulses provided at the input terminal 124 of the buffer circuit 126 are governed by the logic circuit 138 through the voltage control signals.

The programmable voltage pulse generators shown in FIGS. 3-5 may also be called variable voltage generators because they provide voltage signals which vary over time.

Although several embodiments of the invention have been described above for purposes of illustration, various modifications may be made without deviating from the spirit and scope of the invention. As described above, other types of electronic switches may be used instead of the pass gates in the embodiments of the invention shown in FIGS. 3–5. Suitable alternative electronic switches include JFET's, MOSFET's, BJT's and optoelectronic switches. Also, the digital-to-analog converters which serve as a plurality of differentiated voltage sources in the embodiments of the invention shown in FIGS. 4 and 5 may be replaced by any one of many well-known sources of voltage. Numerous variations are well within the scope of this invention.

Accordingly, the invention is not limited except as by the appended claims.

What is claimed is:

1. A programmable pulse generator for generating pulses having programmable voltage levels and providing the pulses to an electrical device, the programmable pulse generator comprising:

a plurality of programmable voltage sources each having a voltage control signal input coupled to receive a voltage control signal and a voltage output, each programmable voltage source being structured to provide a programmed voltage at its voltage output based on the voltage control signal it receives;

a plurality of electronic switches each having an output terminal, a control terminal coupled to receive a control signal which controls a conductive state of the electronic switch, and an input terminal coupled to the voltage output of a respective one of the programmable voltage sources to receive its programmed voltage;

a pulse output terminal coupled to the output terminal of each of the electronic switches; and a control logic circuit having a plurality of outputs, each of a first group of the outputs being coupled to the control terminal of a respective one of the electronic switches to provide the control signal to the electronic switch, and each of a second group of the outputs being coupled to the voltage control signal input of a respective one of the programmable voltage sources to provide the voltage control signal, the control logic circuit being structured to generate the control signal for each electronic switch to render selected electronic switches conductive in a sequence to couple the voltage outputs of selected ones of the programmable voltage sources to the pulse output terminal in a sequence.

2. The programmable pulse generator of claim 1 wherein one of the programmable voltage sources is structured to provide a ground voltage at its voltage output based on the voltage control signal it receives.

3. The programmable pulse generator of claim 1 wherein the control logic circuit is structured to generate the voltage control signal received by each programmable voltage source, the programmed voltage provided by each programmable voltage source being different from the programmed voltages provided by the other programmable voltage sources.

4. The programmable pulse generator of claim 1 wherein each of the electronic switches comprises a pass gate.

5. The programmable pulse generator of claim 1 wherein each programmable voltage source comprises a digital-to-analog converter having an input coupled to a reference voltage.

6. The programmable pulse generator of claim 1, further comprising a buffer circuit having an input coupled to the output terminal of each of the electronic switches and an output coupled to the pulse output terminal.

7. A variable voltage generator for providing a variable voltage to an input terminal of a semiconductor device comprising:

a plurality of voltage sources each having a different voltage level each of a group of the voltage sources including a voltage control signal input coupled to receive a voltage control signal;

a plurality of electronic switches, each electronic switch having an input terminal coupled to a respective one of the voltage sources, a control terminal, and an output terminal coupled to the input terminal of the semiconductor device; and a control logic circuit having a plurality of outputs, each output being coupled to the control terminal of a respective one of the electronic switches, the control logic circuit being structured to generate a plurality of control signals, each control signal being coupled to the control terminal of a respective one of the electronic switches through one of the outputs, the electronic switches being rendered conductive in a sequence by the control signals such that the voltage sources are coupled to the input terminal of the semiconductor device in a sequence. the control logic circuit further being structured to generate each voltage control signal, each voltage control signal being coupled to the voltage control signal input of a respective one of the voltage sources from a port in the control logic circuit, the voltage level of each voltage source being regulated based on the voltage control signal coupled to the voltage control signal input of the voltage source.

8. The variable voltage generator of claim 7 wherein one of the voltage sources is a ground voltage reference.

9. The variable voltage generator of claim 7 wherein each of the group of voltage sources comprises a digital-to-analog converter having an input coupled to a reference voltage source.

10. The variable voltage generator of claim 7 wherein each of the electronic switches comprises a pass gate.

11. The variable voltage generator of claim 7, further comprising a buffer circuit coupled between the output terminal of each of the electronic switches and the input terminal of the semiconductor device.

12. A pulse generator for providing pulses to an input terminal of a semiconductor device comprising:

a plurality of voltage sources each having a different voltage level, each of a the voltage sources being a programmable voltage source having a voltage control signal input coupled to a port of the control logic circuit;

a plurality of electronic switches, each electronic switch having a control terminal, an input terminal coupled to a respective one of a plurality of differentiated voltage sources, and an output terminal coupled to the input terminal of the semiconductor device; and a control logic circuit having a plurality of outputs, each output being coupled to the control terminal of a respective one of the electronic switches, the control logic circuit being structured to render selected ones of the electronic switches conductive in a sequence to couple selected ones of the voltage sources to the input terminal of the semiconductor device in a sequence, the control logic circuit being structured to generate a plurality of voltage control signals, each voltage control signal being coupled from one of the ports to the voltage control signal input of one of the programmable voltage sources, each programmable voltage source being structured to generate a voltage based on the voltage control signal coupled to its voltage control signal input.

13. The pulse generator of claim 12 wherein one of the voltage sources comprises a ground voltage reference.

14. The pulse generator of claim 12 wherein each electronic switch is a pass gate.

15. The pulse generator of claim 12 wherein each of the programmable voltage sources is a digital-to-analog converter including an output coupled to the input terminal of a respective one of the electronic switches and an input coupled to a reference voltage.

16. The pulse generator of claim 12, further comprising a buffer circuit coupled between the output terminal of each of the electronic switches and the input terminal of the semiconductor device.

* * * * *

UNITED STATES PATENT AND TRADEMARK OFFICE
CERTIFICATE OF CORRECTION

PATENT NO. : 6,173,424 B1
DATED : January 9, 2001
INVENTOR(S) : Thomas W. Voshell and R. Brent Lindsay It is certified that error appears in the above-identified patent and that said Letters Patent is hereby corrected as shown below:

Title page,
Title, "PROGRAMMABLE PULSE GENERATOR AND METHOD FOR USING SAME" should read -- PULSE GENERATOR AND VOLTAGE SOURCE FOR GENERATING PULSES AND VOLTAGES HAVING PROGRAMMABLE AMPLITUDES --

Column 6,
Line 5, "level each" should read -- level, each --

Column 7,
Line 16, "sequence. the" should read -- sequence, the --
Line 39, "each of a the voltage" should read -- each of the voltage --

Signed and Sealed this

Twenty-ninth Day of January, 2002

Attest:

JAMES E. ROGAN
Attesting Officer   Director of the United States Patent and Trademark Office